United States Patent [19]

Lauffer et al.

[11] Patent Number: 5,027,253

[45] Date of Patent: Jun. 25, 1991

[54] PRINTED CIRCUIT BOARDS AND CARDS HAVING BURIED THIN FILM CAPACITORS AND PROCESSING TECHNIQUES FOR FABRICATING SAID BOARDS AND CARDS

[75] Inventors: John M. Lauffer, Waverly; Richard A. Schumacher, Endicott, both of N.Y.

[73] Assignee: IBM Corporation, Armonk, N.Y.

[21] Appl. No.: 506,640

[22] Filed: Apr. 9, 1990

[51] Int. Cl.[5] ..................... H05K 7/20; H01L 27/02; H01G 7/00; H01G 4/10
[52] U.S. Cl. .................................. 361/321; 29/25.42; 357/51; 361/386
[58] Field of Search ........ 361/386, 320, 321, 397-401; 174/68.5; 29/25.42; 501/136-138; 357/51

[56] References Cited

U.S. PATENT DOCUMENTS

| | | | |
|---|---|---|---|
| 3,326,718 | 6/1967 | Dill | 29/25.42 X |
| 3,624,895 | 12/1971 | MacIver et al. | 29/25.42 X |
| 3,665,346 | 5/1972 | Orr | 333/70 |
| 3,699,011 | 10/1972 | Nishimura | 204/15 |
| 3,949,275 | 4/1976 | Muenz | 361/402 |
| 4,237,522 | 12/1980 | Thompson | 361/392 |
| 4,328,531 | 5/1982 | Nagashima et al. | 361/401 |
| 4,342,143 | 8/1982 | Jennings | 29/25.42 |
| 4,349,862 | 9/1982 | Bajorek | 361/401 |
| 4,453,176 | 6/1984 | Chance et al. | 357/51 |
| 4,460,938 | 6/1984 | Clei | 361/411 |
| 4,682,414 | 7/1987 | Butt | 29/840 |
| 4,705,917 | 11/1987 | Gates et al. | 174/52 |
| 4,729,061 | 3/1988 | Brown | 361/386 |
| 4,744,008 | 5/1988 | Black et al. | 361/386 |
| 4,751,126 | 6/1988 | Oodaira et al. | 428/139 |
| 4,890,192 | 12/1989 | Smith | 29/25.42 X |
| 4,910,638 | 3/1990 | Berghout et al. | 29/25.42 X |
| 4,958,258 | 9/1990 | Charruau | 361/386 |

FOREIGN PATENT DOCUMENTS

| | | |
|---|---|---|
| 59-5654A | 1/1984 | Japan . |
| 59-54254A | 3/1984 | Japan . |
| 59-82753A | 5/1984 | Japan . |
| 61-6846A | 1/1986 | Japan . |
| 61-112369 | 5/1986 | Japan . |

OTHER PUBLICATIONS

Stress Avoidance in Cofired Two Material Ceramics IBM TDB vol. 22–No. 9, 2/80, J. M. Browlow.
Internal Capacitors & Resistors for Multilayer Ceramic Modules IBM TDB vol. 20–No. 9, 2/78, R. W. Lussow.
Integrated, Low Inductance, Small Area Capacitors for VLSI Semiconductor IBM TDB vol. 25–No. 2, 7/82, C. H. Bajorek et al.
United States Statutory Invention Registration H416, Jan. 5, 1988, Colvin.

*Primary Examiner*—Donald A. Griffin
*Attorney, Agent, or Firm*—Richard M. Goldman

[57] ABSTRACT

Disclosed is a multilayer circuit package having a buried thin film capacitor. The circuit package includes at least a power core, a ground core, a first signal core, a second signal core, and the integral, buried, thin film capacitor. The integral, buried, thin film capacitor serves to capacitively couple the first and second signal cores. Structurally, the first signal core includes at least one first wire that terminates in at least one first electrode, while the second signal core includes at least one second wire that terminates in at least one second electrode. At least a portion of the first electrode overlays at least a portion of the first electrode overlays at least a portion of the second electrode and is separated therefrom by a thin film of a dielectric material. The first electrode, the second electrode, and the thin film of dielectric material define the integral buried capacitor. The thin film capacitor is prepared by thin film methodology, with epitaxial deposition of the dielectric.

11 Claims, 2 Drawing Sheets

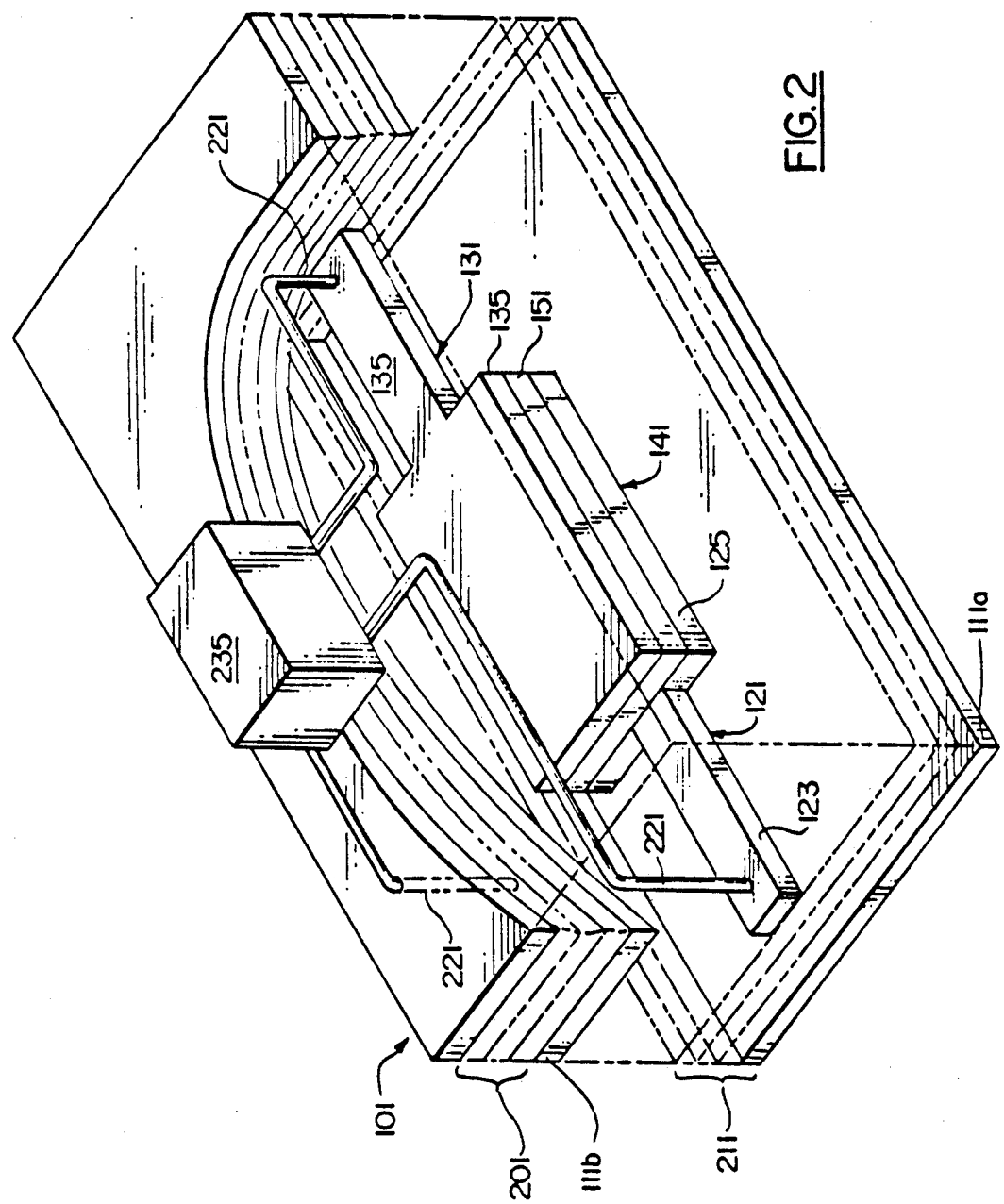

PRINTED CIRCUIT BOARDS AND CARDS HAVING BURIED THIN FILM CAPACITORS AND PROCESSING TECHNIQUES FOR FABRICATING SAID BOARDS AND CARDS

FIELD OF THE INVENTION

This invention relates to multilayer circuit packages, e.g., cards and boards, having internal circuit elements, and more specifically to multilayer circuit cards and boards having structurally integral, internal, buried, thin film, capacitance means. In a preferred embodiment a multilayer circuit package, e.g., a multilayer ceramic circuit package or a multilayer circuit package having polyimide or multilayer epoxy impregnated glass cloth structural members, is provided having at least a power core, a ground core, a first thin film signal core, a second thin film signal core, and a thin film dielectric therebetween, where the first and second thin film signal cores and the thin film dielectric form a thin film capacitor.

BACKGROUND OF THE INVENTION

An electronic circuit may contain many electronic circuit components, e.g., thousands or even millions of individual resistors, capacitors, inductors, diodes, and transistors. These individual circuit components must be interconnected to form the circuits, and the individual circuits must be interconnected to form functional units. Power and signal distribution are done through these interconnections. The individual functional units require mechanical support and structural protection. The electrical circuits require electrical energy to function, and the removal of thermal energy to remain functional. Microelectronic packages, for example, chips, modules, circuit cards, and circuit boards, are used to protect, house, cool, and interconnect circuit components and circuits.

Within an integrated circuit, circuit component to circuit component and circuit to circuit interconnection, heat dissipation, and mechanical protection are provided by an integrated circuit chip. This chip enclosed within its module is referred to as the first level of packaging.

There is at least one further level of packaging. This second level of packaging is the circuit card. The circuit card is necessary for at least three functions. First, the circuit card is employed because the total required circuit or bit count to perform a desired function exceeds the bit count of the first level package, i.e., the chip. Second, the second level package, i.e., the circuit card, provides a site for components that are not readily integrated into the first level package, i.e., the chip or module. These components include, e.g., capacitors, precision resistors, inductors, electromechanical switches, optical couplers, and the like. Third, the circuit card provides for signal interconnection with other circuit elements.

In most applications there is a third level of packaging. This is the board level package. The board contains connectors to accept a plurality of cards.

Package design, that is, card and board design, have been driven by the necessity of accommodating an ever increasing density of interconnections in a small area. In order to accommodate this higher density of interconnections, cards and boards have multilayer structures.

Cards and boards, while used in both digital and analog circuits, find their greatest application in digital circuits. In digital circuits a narrow band around one discrete value of voltage corresponds to a logical "0" and another narrow band around a second discrete value of voltage corresponds to a logical "1." Signals having these properties are "digital signals." Digital information processing depends upon the transmission, storage, and application of these digital signals.

In digital information processing, a signal changes from one binary level to another. This change is ideally transmitted as a "step function." However, this ideal step function becomes distorted because of resistance, capacitance, inductance, and transmission line effects in the transmission line and in other transmission lines in the package. Moreover, this step function, whether ideal or distorted, gives rise to still other distortions and spurious signals, i.e., noise, and induced signals on other lines in the circuit package. Thus, it is necessary to filter noise out of digital circuits.

Filtering may be accomplished in digital circuit packages by providing internal RC filter circuits of appropriate RC time constant and band pass characteristics, and thereby capacitively coupling, or decoupling, signal lines with, for example, power lines, ground lines, or other signal lines.

Attempts at providing internal capacitance and RC circuits to accomplish these ends are well known in the art. For example, U.S. Invention Registration H416, of Kevin W. Colvin, for HIGH CAPACITANCE FLEXIBLE CIRCUIT, published Jan. 5, 1988, describes a multilayer flexible circuit having discrete ceramic capacitors embedded therein. In the circuit package of Colvin the capacitive elements are comprised of chips or wafers of a material different from the flexible substrate, and having a high dielectric constant, with the opposite surfaces of each such chip having a conductive coating.

U.S. Pat. No. 4,682,414 to Sheldon H. Butt for MULTILAYER CIRCUITRY describes a multilayer circuit package having a recess on one surface. As described by Butt, one discrete electronic element is positioned within the recess, while a second discrete electronic element is positioned on the surface of the package.

U.S. Pat. No. 4,705,917 to Louis E. Gates et al. for MICROELECTRONIC PACKAGE describes a microelectronic package having interior openings to provides recesses in which chips and discrete capacitors can be located and connected. Specifically, Gates et al. describe a microelectronic package formed of a plurality of layers of ceramic, with some of the layers having openings in the interior thereof. These internal openings form recesses within the package to carry discrete components. Disclosed discrete components include capacitors.

U.S. Pat. No. 4,729,061 to Candice Brown for CHIP ON BOARD PACKAGE FOR INTEGRATED CIRCUIT DEVICES USING PRINTED CIRCUIT BOARDS AND MEANS FOR CONVEYING THE HEAT TO THE OPPOSITE SIDE OF THE PACKAGE FROM THE CHIP MOUNTING SIDE TO PERMIT THE THE HEAT TO DISSIPATE THEREFROM discloses a circuit package having at least one cavity for mounting an integrated circuit die therein.

U.S. Pat. No. 4,751,126 to Hirosi Oodaira et al. for A METHOD OF MAKING A CIRCUIT BOARD AND A CIRCUIT BOARD PRODUCED THEREBY discloses a flexible circuit package in which flexible substrates are bonded together. Oodaira specifically discloses that a discrete circuit element, such as a capacitor, may be buried between the flexible substrates, utilizing the plastic deformation of the flexible substrate.

U.S. Pat. No. 4,744,008 to Vincent J. Black et al. for FLEXIBLE FILM CHIP CARRIER WITH DECOUPLING CAPACITORS describes a microelectronic package formed of a circuitized polyimide film chip carrier with at least one discrete decoupling capacitor mounted on a surface thereof.

U.S. Pat. No. 4,460,938 to Alain Clei for PROCESS FOR PRODUCING HYBRID CIRCUITS WITH INTEGRATED CAPACITORS AND RESISTORS AND CIRCUITS OBTAINED BY THIS PROCESS describes a hybrid circuit structure, i.e., not a circuit package as such, with thin film capacitors having a valve metal, e.g., tantalum, electrode, and a dielectric of a native oxide of tantalum. The native oxide is formed by anodizing, i.e., oxidizing, the tantalum.

U.S. Pat. No. 4,328,520 to Christopher H. Bajorek et al. for MULTIPLE LAYER, CERAMIC CARRIER FOR HIGH SWITCHING SPEED VLSI CHIPS describes a microelectronic package carrying thin capacitor sheets laminated in a ceramic structure. The capacitor electrode plates may serve as the power distribution conductors (power planes). Alternatively, the electrode plates may be connected to power conducting vias which pass to or through the power planes. The capacitive elements are laminates of thin metallic sheets and dielectric material. The capacitive laminates are formed by successively forming a green (unfired) sheet of the green (unfired) dielectric and the metallic conductor layer thereon to a desired number of layer pairs, firing the green (unfired) laminate to form the capacitive laminate, and circuitizing external surfaces thereof.

According to an alternative exemplification of Bajorek et al. the capacitive laminate is formed by metallizing green (unfired) sheets, sintering the individual metallized green (unfired) sheets, and joining the individual, metallized and fired laminates together, for example with glass and brazing materials, and metallizing the top surface thereof.

U.S. Pat. No. 4,237,522 to David A. Thompson for CHIP PACKAGE WITH HIGH CAPACITANCE, STACKED VLSI/POWER SHEETS EXTENDING THROUGH SLOTS IN SUBSTRATE describes the use of capacitively coupled, insulated power sheets for connecting power from the bus lines to the chips. The insulated power sheets are a thick film laminate of 10 mil thick conductor and 0.5 mil thick dielectric layers.

U.S. Pat. No. 3,949,275 to Wolf-Dieter Muenz for ELECTRIC THIN FILM CIRCUIT AND METHOD FOR ITS MANUFACTURE discloses a thin film circuit having a thin film capacitor with a dielectric layer between a pair of electrodes, where the dielectric is a native oxide of the material used to form the electrode. The electrode is formed of a valve metal, and the native oxide dielectric layer is formed by oxidation, i.e., anodization, of a surface of the electrode material.

U.S. Pat. No. 3,699,011 to Takeo Nishimura for METHOD OF PRODUCING THIN FILM INTEGRATED CIRCUITS discloses a thin film circuit with a thin film capacitor immediately subjacent a semiconductor. The thin film capacitor has a dielectric layer between a pair of electrodes, with the dielectric being a native oxide of the material used to form the electrode. The electrode is formed of an oxidizable metal, e.g., a valve metal, and the native oxide dielectric layer is formed by oxidation, i.e., anodization, of a surface of the electrode material.

U.S. Pat. No. 3,665,346 to William Orr for THIN FILM DISTRIBUTED RC STRUCTURE, a division of U.S. Pat. No. 3,542,654, discloses a thin film RC circuit component on an inert substrate, and consisting of the inert substrate, an anodizable resistive film, an oxide dielectric produced on the anodizable film, and a conductive counter electrode produced on the opposite surface of the dielectric film. The resistive film is a refractory metal that is readily anodized to form a dielectric native oxide.

Laid Open European Patent Application No. 0-083-405 of Dudley A. Chance et al for CHIP CARRIER FOR LARGE SCALE INTEGRATED CIRCUITS AND A METHOD FOR THE FABRICATION OF THE CARRIER, corresponding to U.S. Pat. No. 4,453,176, for LSI CHIP CARRIER WITH BURIED REPAIRABLE CAPACITOR WITH LOW INDUCTANCE LEADS discloses a carrier for LSI chips including a buried capacitor structure. While the exact method of fabricating the capacitor structure is not disclosed, at least one electrode layer of the capacitor structure comprises a plurality of segmented electrode plates. Each of the individual electrode plate segments are individually addressable through individual via lines which extend from the internal electrode segment to severable links on the chip mounting surface of the carrier. The individual severable links can be cut, e.g., by a laser, to repair or delete a defective segment of the capacitor.

Still other buried capacitor structures are shown, for example, in:

a. Japanese Patent Application No. 59-233109, filed Nov. 7, 1984 in the name of Hitachi Ltd. for SEMICONDUCTOR DEVICE, and laid open as Kokai 61-112369 on May 30, 1986. This application describes a capacitor deposited on the external surface of a chip carrier. The capacitor is deposited atop a passivating layer, and includes (i) an aluminum ground layer, (ii) a dielectric layer, exemplified by a silicon nitride layer, (iii) an aluminum power source layer, and (iv) an $SiO_2$ insulating layer.

b. Japanese Patent Application No. 59-127869, filed June 21, 1984 in the name of Nippon Denki K.K. for PLUG-IN PACKAGE WITH CAPACITOR, and laid open as Kokai No. 61-6846 on Jan. 13, 1986. This application describes the use of a discrete internal capacitor chip to filter the power supply to a chip mounted on the package.

c. Japanese Patent Application No. 57-192963 filed Nov. 11, 1982 in the name of Matsushita Denshi Kogyo K.K. for PACKAGE FOR SEMICONDUCTOR DEVICE, and laid open as Kokai No. 59-82753 on May 12, 1984, discloses a microelectronic package where the capacitor is structurally and electrically between an embedded memory chip and the ground plane of the package.

d. Japanese Patent Application 57-164460 filed Sept. 21, 1982 in the name of Nippon Denki K.K. for SEMICONDUCTOR INTEGRATED CIRCUIT DEVICE, and laid open as Kokai 59-54254 on Mar. 29, 1984, discloses a microelectronic package where a resin embedded capacitor is structurally and electrically between a memory chip and the power supply plane of the package.

e. Japanese Patent Application 57-115045 filed June 30, 1982 in the name of Mitsubishi Denki K.K. for SEMICONDUCTOR DEVICE, and laid open as Kokai 59-5654 on Jan. 12, 1984, discloses a capacitor that may be either within a flip chip substrate or on the surface of the flip chip. The capacitor is in parallel with the power supply to the chip.

J. M. Brownlow, STRESS AVOIDANCE IN COFIRED TWO MATERIAL CERAMICS, *IBM Technical Disclosure Bulletin*, Vol. 22, (9) (February 1980), pages 4256–4257 describes the problems arising from the mismatch of coefficients of thermal expansion between the structural ceramic material used in fabricating the package, and the high capacitance ceramics used for relatively thick internal capacitors. Brownlow describes the problem of high stress and cracking occurring when structural ceramic layers are allowed to sinter to titanate high capacitance dielectrics. Brownlow discloses one solution to this problem, where the capacitor, i.e., the titanate and its electrodes, are formed by first forming a resin-ceramic, e.g., from a slurry of resin and ceramic, and thereafter screening a resin-metal pattern onto the resin-ceramic sheets. A resin rich paste is used to mechanically isolate the capacitor from the monolithic package structure, thereby preventing thermal stresses.

R. O. Lussow, INTERNAL CAPACITORS AND RESISTORS FOR MULTILAYER CERAMIC MODULES, *IBM Technical Disclosure Bulletin*, Vol. 20, (9) (February 1978), pages 3436–3437, discloses forming buried internal capacitors by depositing green (unfired) dielectric pastes in appropriately located vias, and firing the green (unfired) package to form capacitive elements.

C. H. Bajorek, D,A, Chance, C. W. Ho, and E. E. Shapiro, INTEGRATED, LOW INDUCTANCE, SMALL AREA CAPACITORS FOR VLSI SEMICONDUCTOR PACKAGES, *IBM Technical Disclosure Bulletin*, Vol. 25, (2) (July 1982), pages 883–888 describes a low inductance parallel plate capacitor structure for electronic packages. The parallel plate capacitor is illustrated as being part of a multi-layer ceramic interposer in FIGS. 2A and 2D of the paper, and as being flush mounted within a pocketed package immediately subjacent the semiconductor chips in FIGS. 2B and 2C of the paper.

As seen above, the art teaches various methods of and structures for providing capacitance in microelectronic packages. These include buried thick film capacitors, surface mounted capacitors, surface film capacitors, and discrete capacitors within various recesses, inserts, and hollows. The mounting of discrete capacitors within the circuit package requires extra fabrication steps. Moreover, the use of discrete capacitors gives rise to inflexiblity in providing specific RC time constants, pass band widths, capacitive coupling, and capacitive decoupling.

The use of thick film methodologies, i.e., successive laminating and sintering of interleaved layers of green (unfired) dielectric and metallic conductor, is not an altogether satisfactory solution. Multilevel vias are required. There is minimal design control of the capacitor parameters, dielectric thickness and electrode area. Moreover, thick film hetero-structures within the package introduce thermal expansion mismatches into structural package members.

Thus, a clear need exists for a simple package fabrication method that provides the ability to obtain specific values of package capacitance, while preserving the structural, thermal, and electrical integrity of the package.

OBJECTS OF THE INVENTION

Thus, it is one object of the invention to provide a simple electronic package fabrication method including the fabrication of internal capacitance means.

It is a primary object of the invention to remove passive elements from the surface of the package, thereby increasing the fraction of surface area of the package available for logic circuit chips and modules, and increasing the packing density of the package.

It is a further object of the invention to obtain specific values of package and circuit capacitance in the fabrication process.

It is a further object of the invention to obtain internal capacitance while preserving the structural, thermal, and electrical integrity of the electronic package.

It is a still further object of the invention to provide a thin film method of fabricating internal capacitance structures in an electronic package.

It is a still further object of the invention to provide an electronic package having a thin film internal capacitor.

It is still a further object of the invention to provide an electronic package having simplified wiring routes, e.g., where the capacitor to active component wiring is through a small number of vias and through holes.

It is still a further object of the invention to provide an package requiring fewer through holes and solder joints, with a concomitant reduction in drill unit hours and an increase in product yield and reliability.

It is still a further object of the invention to reduce line delay through closer proximity of the capacitors to the active components.

It is still a further object of the invention to provide the internal, thin film capacitor having electrodes of high conductivity.

It is still a further object of the invention to provide the internal, thin film capacitor having a dielectric of high dielectric constant.

It is still a further object of the invention to provide an electronic package having an internal, thin film capacitor characterized by electrodes having a high electrical conductivity, i.e., a higher electrical conductivity then those metals which readily form high dielectric constant native oxides (as Y, Ti, Zr, Ta, Hf, Nb, Mo, and W), in combination with a high dielectric constant thin film therebetween, i.e., a dielectric having a relative dielectric constant of the magnitude heretofore associated with oxides of Y, Ti, Bi, Sb, Zr, Ta, Hf, Nd, Mo, and W.

SUMMARY OF THE INVENTION

These objects are obtained and the deficiencies of the prior art are obviated by the thin film fabrication method and the multilayer, thin film, electronic circuit package produced thereby as described herein.

By "thin film electronic circuit packages" are meant electronic circuit packages having one or more internal thin film capacitors. By "internal capacitors" are meant capacitors within the electronic circuit package, with at least one electrode surface thereof accessible only by vias or through holes. By "thin film capacitors" are meant capacitors where one or both electrodes of the capacitor may have a thickness less then about 100 microns, the dielectric layer of the capacitor has a thickness less then about 12 microns, and the dielectric layer is formed by thin film deposition methodologies. By "thin film deposition methodologies" are meant those epitaxial fabrication methodologies utilized in the electronic fabrication art for thin film devices, including, but not limited to, evaporation, chemical vapor deposition, plasma assisted chemical vapor deposition, particle beam epitaxy, sputtering, cosputtering, reactive sputtering, and the like. These epitaxial methodologies are to be distinguished from oxidation of the underlying electrode structure to form native oxide dielectrics.

According to a preferred exemplification of the invention, a first conductive plane, as a signal plane or core, or a power plane or core, including a ground plane or core, is circuitized for use as a capacitor electrode. Thereafter, a thin film dielectric is deposited thereon by thin film methods, as, for example chemical vapor deposition, particle beam epitaxy, sputtering, reactive sputtering, or reactive cosputtering. The method of forming the thin film dielectric is preferably epitaxial deposition rather then anodization of the underlying electrode material. A thin film of a conductive material is deposited atop the thin film dielectric, as for example, a sputtered copper thin film layer. The thin film of conductive material may be patterned by sputtering through a mask, or it may be patterned by photolithography and etching. Thereafter, further layers of dielectric, conductor, or both, may be deposited above the thin film capacitor to form the composite laminate circuit package. Typically the capacitors are wired through vias or through holes.

According to the disclosed invention the conductive elements, e.g., the signal cores or planes, the power cores or planes, and the ground cores or planes, may be formed of either metallic conductors or of conductive polymers. Most commonly they are formed of metallic conductors, as thin film metallic conductors, thick film metallic conductors, or metallic foil conductors. When the conductors, as the signal cores, and the ground and power cores, are metallic, the metallic conductor is most commonly chosen from the group consisting of Al and the metals of Group 1B of the Periodic Chart, Cu, Ag, and Au. Especially preferred is Cu. Cu is preferred because of its high electrical conductivity, especially as compared to those metals that readily form stable native oxides, as Ti, Ta, Zr, Hf, W, and Mo. Generally, the metallic conductor is from about 100 Angstroms to about 100 microns thick.

The dielectric is a thin film, with its thickness determined by the relationship $$C = \epsilon(S/d)$$

where C is the desired capacitance; $\epsilon$ is epsilon, the dielectric permitivity of the dielectric thin film; S is the area of overlay of the two electrodes; and d is the spacing between the two electrodes, which is approximately the thickness of the dielectric thin film. Preferably, the thin film of dielectric material is from about 100 Angstroms to about 10 microns thick.

In order to precisely control the capacitance, the thickness, d, of the dielectric must be precisely controlled. According to the invention, the required precise thickness control is obtained by the use of controllable thin film fabrication methodology. This may be accomplished by vacuum deposition of the dielectric, as distinguished from anodization of an underlying valve metal electrode to form a native oxide thereof. For example, the vacuum deposited thin film of dielectric material may be a sputtered thin film, e.g., a reactively sputtered thin film.

Various dielectric materials may be used to form the dielectric thin film of the capacitor. These include organic polymers, as polyimides and polyfluorocarbons, as well as inorganic materials. One class of exemplary, sputterable dielectrics are ceramics. One exemplary class of ceramics are those chosen from the group consisting of calcium titanate, barium titanate, aluminum oxide, berylium oxide, and aluminum nitride.

The electronic circuit packages of the invention include at least a power core or plane, a ground core or plane, a first signal core or plane, a second signal core or plane, and the integral buried thin film capacitor, fabricated as described above. The integral buried thin film capacitor serves to capacitively couple, or decouple, the first and second signal cores. Structurally, the first signal core includes at least one first wire that terminates in at least one first electrode, while the second signal core includes at least one second wire that terminates in at least one second electrode. At least a portion of the first electrode overlays at least a portion of the second electrode and is separated therefrom by the thin film of a dielectric material. The first eletrode, the second electrode, and the thin film of dielectric material define the integral buried thin film capacitor.

According to one exemplification of the invention one of the signal cores in series with the thin film capacitor is at ground potential. Alternatively, one of the signal cores in series with the thin capacitor may be at power supply potential.

In a particularly preferred exemplification the circuit package, which may be a card or a board, as described hereinabove, includes:

(a) A first signal core which includes at least one first thin film copper wire terminating in at least one first copper electrode.

(b) A second signal core which includes at least one second thin film copper wire terminating in at least one second electrode. At least a portion of the first copper electrode overlays at least a portion of the second copper electrode, where the overlay is the surface area, S, defined hereinabove.

(c) A reactively sputtered thin film of a dielectric material between the first copper electrode and the second copper electrode. The thickness of the dielectric is the thickness, d, defined hereinabove.

The first electrode, the second electrode, and the thin film of dielectric material define an integral buried thin film capacitor within the multilayer circuit card.

The invention provides an electronic package having a thin film internal capacitor and a simple electronic package fabrication method for the thin film, internal capacitance means, with the capability of obtaining specific values of package capacitance, while preserving the structural, thermal, and electrical integrity of the electronic package. The electronic package of the invention has simplified wiring routes, e.g., with the capacitor to active component wiring through a small number of vias or through holes. This not only results in increased surface area available for active devices with higher interconnect densities, fewer vias or through holes and solder joints, with concomitant reductions in drill unit hours and increases in product yield and reliability, but also in reduced line delay through closer proximity of the thin film capacitors to the active components.

THE FIGURES

The invention may be more fully understood by reference to the figures, described hereinbelow.

FIG. 2 is a phantom perspective view of a circuit package of the invention.

DETAILED DESCRIPTION OF THE INVENTION

Figure 1:
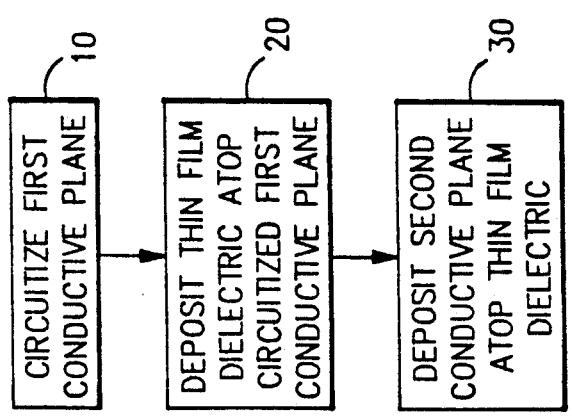
FIG. 1 is a simplified flow chart of the method of the invention.

A flow chart of one exemplification of the invention is shown in FIG. 1. The method of the invention interposes capacitor fabrication steps with the general manufacturing steps for electronic packages. The general manufacturing processes for electronic packages are described in, for example, Donald P. Seraphin, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

A preliminary step in the fabrication of the buried, thin film capacitor is the circuitization of a first conductive plane. This circuitization step is shown in block 10 of FIG. 1. The first conductive plane may be a signal plane or core, a ground plane or core, or a power plane or core. Regions of the circuitized first conductive plane or core are a first electrode region of the capacitor.

Subsequently, a thin film dielectric is deposited atop the first conductive plane, as shown in block 20 of FIG. 2. This dielectric film is deposited by thin film epitaxy methods, as distinguished from anodization methods. Exemplary thin film epitaxy methods for the deposition of the dielectric thin film include evaporation; chemical vapor deposition; plasma assisted chemical vapor deposition, as glow discharge plasma deposition, and microwave plasma deposition; particle beam epitaxy, and sputtering. Exemplary methods of sputtering include simple sputtering, e.g., where the target material atoms are deposited on the substrate; cosputtering where target material atoms from two or more different targets are simultaneously or sequentially deposited on a substrate; reactive sputtering, where a reaction product of the substrate and a gaseous component present during sputtering is deposited; and reactive cosputtering, where the reaction product or products of the materials in the sputtering target or targets and the gaseous component are deposited on the substrate.

Thereafter, as shown in block 30 of FIG. 1, a second thin film of a conductive material is deposited atop the thin film dielectric. This second conductive film may be a sputtered copper thin film layer.

The circuitization steps represented by blocks 10 and 30 of FIG. 1 may be carried out by various methods. For example, the thin films of conductive material, i.e., the first and second thin films of conductive material, may be circuitized, i.e., patterned, by sputtering through a mask. Alternatively, the layers may be patterned by conventional photolithography and etching, e.g., wet etching or dry etching. Thereafter, further layers of dielectric, conductor, or both, may be deposited above the thin film capacitor to form the composite laminate circuit package. Typically the capacitors are wired through vias or through holes in subjacent and superjacent layers.

While the method and apparatus of the invention is described and illustrated with reference to copper conductive cores and planes, it is to be understood that the conductive elements may be formed of either metallic conductors or of conductive polymers. Most commonly the conductive cores and planes are metallic conductors, as thin film metallic conductors, thick film metallic conductors, or metallic foil conductors. When the conductors, as the signal cores, the ground, and the power core are metallic, the metallic conductor is most commonly chosen from the group consisting of Cu, Al, and Ag. Especially preferred is Cu. Cu is preferred because of its high conductivity, especially as compared to those materials which may be anodized to form a native oxide dielectric, i.e., valve metals. Generally, the metallic conductor is a thin film metallic conductor, e.g., from about 100 Angstroms to about 100 microns thick.

The method of the invention allows precise control of the thickness of the dielectric thin film during the deposition step of block 20 of FIG. 1. The design thickness of the dielectric thin film is determined by the relationship $$C = \epsilon(S/D)$$

where C is the desired capacitance; $\epsilon$ is epsilon, the dielectric permitivity of the dielectric thin film; S is the area of overlay of the two electrodes; and d is the spacing between the two electrodes. The spacing, d, is approximately the thickness of the dielectric thin film. Precise control of the as fabricated spacing, d, is a function of the deposition process.

In order to precisely control the capacitance, the thickness, d, of the dielectric must likewise be precisely controlled. According to the invention, the required precise thickness control is obtained by the use of epitaxial thin film fabrication methodology. This may be accomplished by vacuum deposition of the dielectric. For example, the vacuum deposited thin film of dielectric material may be a sputtered thin film, e.g., a reactively sputtered thin film. In this regard, sputter deposition rates are typically on the order of about 0.5 to 40 Angstroms per second, with sputtering time and potential being precisely controllable. Preferably, the thin film of dielectric material is from about 100 Angstroms to about 10 microns thick.

The quotient of the capacitor area divided by the capacitor electrode spacing, S/d, is determined by the desired circuit characteristics of the electronic package, with specific values of the capacitor area, S, and the electrode spacing, d, being determined by thermal, mechanical, wirability, and fabricability considerations. The shape of the capacitor is not critical to the invention, and will typically be determined by such factors as electromagnetic induction between wires, fabricability, and the locations of vias and through holes. The capacitor may be, for example, circular, rectangular, or even serpentine.

Various dielectric materials may be used to form the dielectric thin film of the capacitor. These dielectrics include organic polymers, as polyimides and polyfluorocarbons, as well as inorganic materials. One class of exemplary, sputterable dielectrics are those chosen from the group consisting of calcium titanate, barium titanate, aluminum oxide, berylium oxide, and aluminum nitride. Materials such as calcium titanate and barium titanate are typically sputtered from a multicomponent sputtering target or reactively cosputtered from separate targets in the presence of oxygen. Materials such as berylium oxide and aluminum nitride are typically sputtered from a multicomponent sputtering target or reactively from, for example, a berylium sputtering target in an oxygen containing atmosphere or an aluminum sputtering target in a nitrogen containing gas.

Epitaxial deposition and growth of a material having a high dielectric constant, on electrodes having a high electrical conductivity, allows matching of high conductivity electrodes, as Cu, Ag, Au, or Al electrodes, with high dielectric constant dielectrics, as oxides of, e.g., Y, Ti, Bi, Sb, Zr, Ta, Hf, Nb, Mo, and W. In this way, epitaxial growth of the dielectric thin film allows the design and fabrication of electronic packages having an internal, thin film capacitors characterized by (1) electrodes having a high electrical conductivity, i.e., a higher electrical conductivity then those metals which readily form high dielectric constant native oxides (as Y, Ti, Zr, Ta, Hf, Nb, Mo, and W), (2) in combination with high dielectric constant thin films therebetween, i.e., dielectrics having relative dielectric constants of the magnitude heretofore associated with oxides of Y, Ti, Bi, Sb, Zr, Ta, Hf, Nd, Mo, and W.

An electronic circuit package 101 of the invention, the buried thin film capacitor 151, additional cores 201 and 211, and one chip 235, is shown in simplified phantom view in FIG. 2. This electronic circuit package includes at least a power core or plane 111a, a ground core or plane 111b, a first signal core or plane 121, a second signal core or plane 131, and the integral buried thin film capacitor 141. The thin film capacitor 141 is fabricated as described above. The integral buried thin film capacitor 141 capacitively couples, or decouples, for example, the first 121 and second 131 signal cores. Structurally, the first signal core 121 includes at least one first wire 123 that terminates in at least one first electrode 125, while the second signal core 131 includes at least one second wire 133 that terminates in at least one second electrode 135. At least a portion of the first electrode 125 overlays at least a portion of the second electrode 135 and is separated therefrom by a thin film 151 of a dielectric material.

The first electrode 125, the second electrode 135, and the thin film 151 of dielectric material define the integral buried thin film capacitor 141 of the invention.

According to one exemplification of the invention one of the signal cores 121 or 131 in series with the thin film capacitor 141 is at ground potential. Alternatively, one of the signal cores 121 or 131 in series with the thin film capacitor 141 may be at power supply potential. The thin film capacitor 141 of the invention is in series with other planes of the circuit package through vias 221.

In a particularly preferred exemplification the circuit package 101 may be a card or a board, as described hereinabove. The circuit package includes:

(a) A first signal core 121 which includes at least one first thin film copper wire 123, e.g., a copper wire about 12 to about 100 microns thick, terminating in at least one first copper electrode 125, also from about 12 to about 100 microns thick.

(b) A second signal core 131 which includes at least one second thin film copper wire 133, from about 100 Angstroms to about 100 microns thick, and generally from about 3 microns to about 100 microns thick, terminating in at least one second electrode 135, also from about 100 Angstroms to about 100 microns thick, and generally from about 3 microns to about 100 microns thick.

At least a portion of the first copper electrode 125 overlays at least a portion of the second copper electrode 135, where the overlay is the surface area, S, defined hereinabove.

It is to be noted that one of the first electrode 125 or the second electrode 135 may be at the input potential, i.e., as a power plane, or at ground potential, i.e., as a ground plane.

(c) A reactively sputtered epitaxial thin film 151 of a dielectric material between the first copper electrode 125 and the second copper electrode 135. The thickness, d, of the dielectric thin film 151 is determined by the dielectric constant of the material, the area, S, and the desired capacitance C of the capacitor 141. The resulting thickness of the dielectric 151 is the thickness, d, defined hereinabove. The thickness, d, of the dielectric thin film 151 is generally from about 100 Angstroms to about 10 microns.

The first electrode 125, the second electrode 135, and the thin film 151 of dielectric material define an integral buried thin film capacitor 141 within the multilayer circuit package 101.

The invention may be further understood by reference to the Example below.

EXAMPLE

Figure 3:
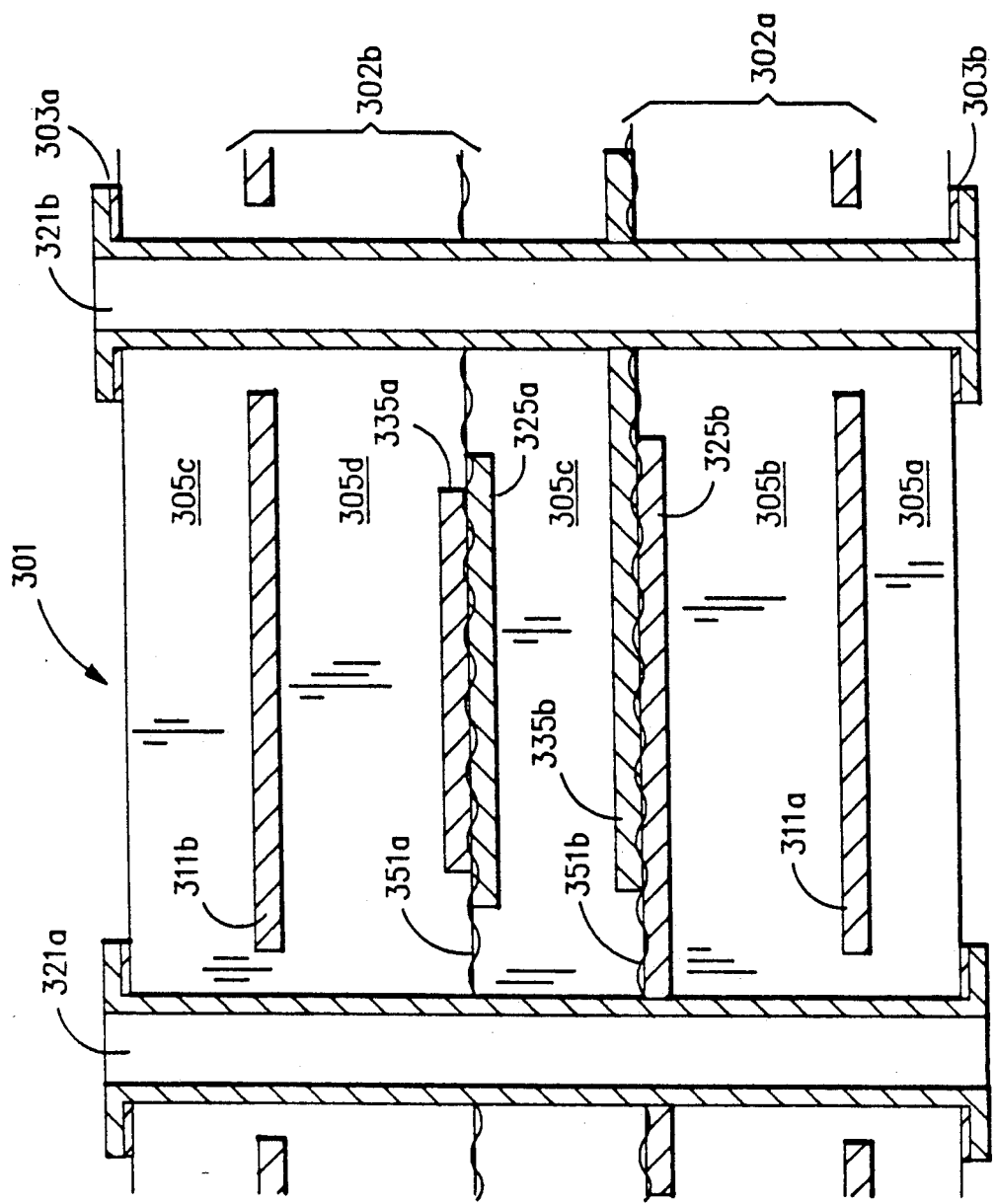
FIG. 3 is a cross sectional drawing of a circuit package prepared as described in the EXAMPLE, and having two buried thin film capacitors of the invention.

The prototype electronic package shown in FIG. 3 was fabricated. The signal/power core 302a was formed by laminating a 1 oz (36 Micron) copper foil 311a and a 0.5 oz (18 Micron) copper foil 325b to a teflon dielectric material 305b. Plane 311a and plane 325b were circuitized through conventional printed circuit board photolithography means to form the finished power plane 311a and a finished signal/capacitor electrode plane 325b.

After circuitization, a thin film of 351b of barium titanate, $BaTiO_3$, was sputtered atop the first signal/capacitor electrode 325b. This thin film was approximately 1000 Angstroms thick. Thereafter, a second capacitor electrode was formed by sputter seeding a copper layer 335b onto the dielectric thin film 351b, and thereafter depositing additional copper through acid copper plating to a total thickness of 0.5 oz (18 Microns). The second capacitor electrode plane 335b was patterned to form the second electrode with extension to a land that will connect to the thru via 321b. The first signal plane electrode 325b, the dielectric thin film 351b, and the second capacitor electrode plane 335b define a first capacitor.

A second internal, thin film capacitor was formed in the electronic circuit package 301 by the same means used to form the first capacitor layer. A signal/power core 302b was formed by laminating a 1 oz copper foil 311b and a 0.5 oz copper foil layer 335a to a teflon dielectric material 305d. The signal/power core 302b was circuitized to form a second power plane 311b and a second signal plane 335a including a first capacitor electrode.

After circuitization, a thin film 351a of barium titanate, $BaTiO_3$, was sputtered atop the second signal plane 335a. This thin film 351a was also approximately 1000 Angstroms thick. Thereafter, the second capacitor electrode 325a for the second capacitor layer was formed by sputter seeding a thin film of copper and electrolytically copper plating to a total thickness of 18 Microns. Plane 325a was patterned to form the second capacitor electrode for the second capacitor plane. The second signal plane/electrode 335a, the dielectric thin film 351a, and the second capacitor electrode 325a define a second thin film internal capacitor. This second thin film internal capacitor terminates in thru vias that are not illustrated in the plane of FIG. 3.

The multilayer laminate with two (2) internal capacitor layers was completed by laminating together the full structure in the sequence illustrated and described from bottom up as follows: 0.5 oz (18 Micron) copper foil 303b. teflon dielectric material 305a, first power/signal/capacitor core 302a, a second teflon dielectric layer 305e, and a top 0.5 oz copper foil 303a. Thru vias 321a and 321b were then drilled in the multilayer laminate. Electrolytically plated copper was then deposited on the surface of the laminate as well as in the thru vias 321a and 321b to interconnect the internal capacitors to the laminate external surface. The multilayer laminate external surfaces were then patterned to form a third signal/-component mounting plane 303a and a fourth signal/-component mounting plane 303b.

While the invention has been described with respect to certain preferred embodiments and exemplifications thereof, it is not intended to limit the scope of the invention thereby, but solely by the claims appended hereto.

We claim:

1. A multilayer microelectronic circuit package including:
   (1) an integral, thin film, buried capacitor comprising:
      (a) a first signal core comprising at least one first thin film copper wire having at least one first thin film copper electrode;
      (b) a second signal core comprising at least one second thin film copper wire having at least one second thin film copper electrode, at least a portion of said first thin film copper electrode overlying at least a portion of said second thin film copper electrode; and
      (c) an epitaxial thin film of a dielectric material between said first copper electrode and said second copper electrode; said thin film first copper electrode, said thin film second copper electrode, and said thin film of dielectric material define the integral buried thin film capacitor capacitively coupling said thin film signal cores within said multilayer circuit package; and
   (2) an integrated circuit chip bonded to said multilayer circuit package and electrically interconnected to one of said capacitively coupled thin film signal cores.

2. The multilayer microelectronic circuit package of claim 1 wherein one of said thin film signal cores is at ground potential.

3. The multilayer microelectronic circuit package of claim 1 wherein the thin film dielectric is a ceramic chosen from the group consisting of calcium titanate, barium titanate, aluminum oxide, berylium oxide, and aluminum nitride.

4. The multilayer microelectronic circuit package of claim 3 wherein the thin film ceramic dielectric is a reactively sputtered ceramic.

5. A multilayer microelectronic circuit package including:
   (1) an integral, thin film, buried capacitor comprising:
      (a) a first signal core comprising at least one first thin film copper wire having at least one first thin film copper electrode;
      (b) a second signal core comprising at least one second thin film copper wire having at least one second thin film copper electrode, at least a portion of said first thin film copper electrode overlying at least a portion of said second thin film copper electrode; and
      (c) a thin film of a dielectric material between said first copper electrode and said second copper electrode, said thin film of a dielectric material being a reactively sputtered thin film of a ceramic dielectric;
   one of said thin film copper signal cores being at ground potential;
   said thin film first copper electrode, said thin film second copper electrode, and said thin film of dielectric material define the integral buried thin film capacitor capacitively coupling said thin film signal cores within said multilayer circuit package; and
   (2) an integrated circuit chip bonded to said multilayer circuit package and electrically interconnected to one of said capacitively coupled thin film signal cores.

6. A multilayer microelectronic circuit package including:
   (1) an integral, thin film, buried capacitor comprising:
      (a) a first signal core comprising at least one first thin film copper wire having at least one first thin film copper electrode;
      (b) a second signal core comprising at least one second thin film copper wire having at least one second thin film copper electrode, at least a portion of said first thin film copper electrode overlying at least a portion of said second thin film copper electrode; and
      (c) a thin film of a dielectric material between said first copper electrode and said second copper electrode, said thin film of a dielectric material being a reactively sputtered thin film of a ceramic dielectric chosen from the group consisting of calcium titanate, barium titanate, aluminum oxide, berylium oxide, and aluminum nitride;
   one of said thin film copper signal cores being at ground potential;
   said thin film first copper electrode, said thin film second copper electrode, and said thin film of dielectric material define the integral buried thin film capacitor capacitively coupling said thin film signal cores within said multilayer circuit package; and
   (2) an integrated circuit chip bonded to said multilayer circuit package and electrically interconnected to one of said capacitively coupled thin film signal cores.

7. A method of fabricating a multilayer circuit package comprising a first signal core, a second signal core, and integral buried thin film capacitor means capacitively coupling said first and second signal cores, which method comprises:
   (a) circuitizing said first signal core on a dielectric substrate to form an electrode;
   (b) reactively sputtering a thin film of dielectric chosen from the group consisting of calcium titanate, barium titanate, aluminum oxide, berylium oxide, and aluminum nitride atop said electrode of the circuitized first signal core; and
   (c) circuitizing said second signal core atop said thin film of dielectric to form an electrode thereon.

8. The method of claim 7 comprising forming said first and second signal cores of a metallic conductor chosen from the group consisting of Cu, Al, and Ag.

9. The method of claim 8 comprising forming said first and second signal cores of Cu.

10. The method of claim 7 comprising depositing said first conductor to an electrode thickness of from about 100 Angstroms to about 100 microns thick.

11. The method of claim 7 comprising depositing the dielectric thin film to a thickness of from about 100 Angstroms to about 10 microns.

* * * * *